(12) United States Patent
Ishizuka et al.

(10) Patent No.: US 7,846,637 B2
(45) Date of Patent: Dec. 7, 2010

(54) MATERIAL FOR FORMING RESIST PROTECTIVE FILM FOR USE IN LIQUID IMMERSION LITHOGRAPHY PROCESS AND METHOD FOR FORMING RESIST PATTERN USING THE PROTECTIVE FILM

(75) Inventors: Keita Ishizuka, Kawasaki (JP); Kazumasa Wakiya, Kawasaki (JP); Kotaro Endo, Kawasaki (JP); Masaaki Yoshida, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 752 days.

(21) Appl. No.: 11/587,509

(22) PCT Filed: Apr. 25, 2005

(86) PCT No.: PCT/JP2005/007846

§ 371 (c)(1),
(2), (4) Date: Jul. 23, 2007

(87) PCT Pub. No.: WO2005/103098

PCT Pub. Date: Nov. 3, 2005

(65) Prior Publication Data

US 2008/0032202 A1 Feb. 7, 2008

(30) Foreign Application Priority Data

Apr. 27, 2004 (JP) ............................. 2004-132081

(51) Int. Cl.
G03F 7/09 (2006.01)
C08F 12/20 (2006.01)

(52) U.S. Cl. .................. 430/270.1; 430/271.1; 526/242

(58) Field of Classification Search .............. 430/270.1, 430/271.1; 526/242, 245
See application file for complete search history.

(56) References Cited

U.S. PATENT DOCUMENTS

| | | | |
|---|---|---|---|
| 4,387,222 A * | 6/1983 | Koshar ........................... 544/4 |
| 4,491,628 A | 1/1985 | Ito et al. |
| 5,069,997 A | 12/1991 | Schwalm et al. |
| 5,130,223 A * | 7/1992 | Nishimura et al. .......... 430/166 |
| 5,207,513 A | 5/1993 | Kondo et al. |
| 5,350,660 A | 9/1994 | Urano et al. |
| 5,585,219 A | 12/1996 | Kaimoto et al. |
| 5,994,005 A | 11/1999 | Anderson et al. |
| 6,057,080 A | 5/2000 | Brunsvold et al. |
| 6,365,322 B1 | 4/2002 | Padmanaban et al. |
| 6,447,980 B1 | 9/2002 | Rahman et al. |
| 6,451,510 B1 * | 9/2002 | Messick et al. .............. 430/311 |
| 6,555,510 B2 * | 4/2003 | Lamanna et al. ............. 510/175 |
| 2002/0183459 A1 | 12/2002 | Tortelli et al. ............. 525/326.2 |
| 2003/0078352 A1 * | 4/2003 | Miyazawa et al. .......... 526/245 |
| 2003/0194644 A1 * | 10/2003 | Hatakeyama et al. ..... 430/270.1 |
| 2003/0194645 A1 * | 10/2003 | Harada et al. ............. 430/270.1 |
| 2003/0203648 A1 | 10/2003 | Awad et al. |
| 2004/0166433 A1 * | 8/2004 | Dammel et al. .............. 430/176 |
| 2005/0014090 A1 | 1/2005 | Hirayama et al. ......... 430/270.1 |
| 2005/0202351 A1 * | 9/2005 | Houlihan et al. ............ 430/322 |
| 2007/0218399 A1 * | 9/2007 | Koshiyama et al. ......... 430/269 |
| 2009/0197199 A1 * | 8/2009 | Ishizuka et al. .......... 430/273.1 |

FOREIGN PATENT DOCUMENTS

| | | |
|---|---|---|
| EP | 0794458 | 9/1997 |
| EP | 0935169 A2 | 8/1999 |
| EP | 1493761 A1 | 1/2005 |
| JP | 05-132451 * | 5/1993 |
| JP | 11-176727 | 7/1999 |
| JP | 2002-348315 | 12/2002 |
| JP | 2003-167352 | 6/2003 |
| JP | 2004-325466 | 11/2004 |
| JP | 2005-099646 | 4/2005 |
| KR | 2004-0002451 | 1/2004 |
| KR | 20060130241 | 12/2006 |
| WO | 97 33198 | 9/1997 |

(Continued)

OTHER PUBLICATIONS

Office Action issued to TW Application No. 94113279, mailed Feb. 27, 2009.

(Continued)

Primary Examiner—Cynthia H Kelly
Assistant Examiner—Anca Eoff
(74) Attorney, Agent, or Firm—Hoffmann & Baron, LLP

(57) ABSTRACT

The liquid immersion lithography process is configured so that the resist pattern resolution is improved by exposing a resist film to the lithographic exposure light under the conditions in which the predetermined thickness of the liquid for liquid immersion lithography, of which the refractive index is higher than that of air and smaller than that of the resist film is intervened at least on the resist film in a path of the lithography exposure light reaching the resist film, a protective film is formed on the surface of the resist film to be used. Therefore, when various immersion liquid, water being the representative example is used in the liquid immersion lithography process can be formed, the deterioration of the resist film and the immersion liquid to be used are simultaneously prevented, and the number of the process steps are not increased, and then the resist pattern having higher resolving ability.

10 Claims, No Drawings

FOREIGN PATENT DOCUMENTS

| | | |
|---|---|---|
| WO | WO 2004/068242 | 8/2004 |
| WO | WO 2004/076535 | 9/2004 |

OTHER PUBLICATIONS

The Extended European Search Report issued to EP Application No. 05734725.4, mailed Jul. 1, 2009.

Hoffnagle et al.; Liquid immersion deep-ultraviolet interferometric lithography; Journal of Vacuum Science & Technology B; vol. 17, No. 6; American Vacuum Society; Nov./Dec. 1999; pp. 3306-3309.

Switkes et al.; Immersion lithography at 157 nm; Journal of Vacuum Science & Technology B; Vo. 19, No. 6, American Vacuum Society; Nov./Dec. 2001; pp. 2353-2356.

Switkes et al.; Resolution Enhancement of 157 nm Lithography by Liquid Immersion; Proceedings of SPIE; vol. 4691, 2002; pp. 459-465.

Notice of Reasons for Rejection issued to KR Application No. 10-2008-7025967, mailed Sep. 21, 2009.

Office Action issued to KR Patent No. 10-0887202 (Appeal No. 2009W on 1380), mailed May 11, 2010.

* cited by examiner

MATERIAL FOR FORMING RESIST PROTECTIVE FILM FOR USE IN LIQUID IMMERSION LITHOGRAPHY PROCESS AND METHOD FOR FORMING RESIST PATTERN USING THE PROTECTIVE FILM

TECHNICAL FIELD

The present invention relates to a material for use in forming a resist film preferably used in a liquid immersion lithography process, in particular, the liquid immersion lithography process in which resist pattern resolution is enhanced by exposing the resist film to light through an intervening liquid in a predetermined thickness whose refractive index is higher than that of air and lower than that of the resist film on at least the resist film in the path of the lithography exposure light reaching the resist film, and a method for forming a resist pattern using the material used in forming the protective film.

BACKGROUND ART

Conventionally, a lithography method has been used in fabricating fine structures in a various kinds of electronic devices such as semiconductor devices and liquid crystal devices. However, the need for micro-fabrication of resist patterns in lithography processes has arisen as device structures have been miniaturized.

At present, in the most advanced areas nowadays, for example, the lithography method can form a fine resist pattern which has a line width of about 90 nm; however, a finer pattern formation will be desired in the near future.

To achieve micro-fabrication of patterns of line widths finer than 90 nm, the success of the development of a photolithography machine and a resist suitable for the machine is the most important key. In the photolithography machines, development has generally been focused on shortening the wavelengths of light sources, such as $F_2$ excimer lasers, EUV (extreme ultraviolet radiation), electron beams, X-rays, and soft X-rays, as well as on increasing the numerical aperture (hereinafter, simply referred to as NA) of lenses.

However, shortening of the wavelengths of light sources requires a new, expensive photolithography machine and further, increasing the NA raises the problem that the depth of focus is reduced even if resolving ability is improved because of the trade-off lies between resolving ability and depth of focus.

Recently, as a lithography technique enabling the solution of such problems, a method referred to as a liquid immersion lithography has been reported (for example, see Non-patent documents 1 to 3). In this method, a predetermined thickness of liquid refractive index medium (refractive index liquid or immersion liquid) such as deionized water or fluorinated inert liquid is placed on at least a resist film between the lens and the resist film on a substrate during exposure. In this method, instead of a conventional inert gas such as air or nitrogen used in a conventional method, a liquid with a larger refractive index (n), for example, deionized water is placed in the exposing light beam path space so as to achieve higher resolving ability and no reduction in depth of focus with the use of a light source with the same wavelength as the conventional one even if shorter wavelengths or any high NA lenses are used.

This liquid immersion lithography draws special attention, because it enables the formation of resist patterns with a higher resolving ability and superior depth of focus at a lower cost even if the lenses attached to the existing machine are used.

Non-patent document 1: Journal of Vacuum Science & Technology B (J. Vac. Sci. Technol. B) ((published in) U.S.A.), 1999, Vol. 17, No. 6, 3306-3309);

Non-Patent Document 2: Journal of Vacuum Science & Technology B (J. Vac. Sci. Technol. B) ((published in) U.S.A.), 2001, Vol. 19, No. 6, 2353-2356); and Non-patent Document 3: Proceedings of SPIE ((published in) U.S.A.), 2002, Vol. 4961, 459-465.

However, in the liquid immersion lithography process, the resist film is directly in contact with the refractive index liquid (immersion liquid) during exposure, and hence the resist film is vulnerable to invasion by the liquid. Thus, conventional resist compositions need to be tested to determine whether they can be used in the liquid immersion lithography.

Currently used resist compositions have been established through extensive searches for resins providing with the most essential property which has transparency to the exposure light. The present inventors have conducted experiments in an effort to obtain resist compositions having suitable properties for use in liquid immersion lithography and to determine if conventional resist compositions can be used in liquid immersion lithography with or without slight modifications. As a result, it has been found that promising resist compositions from a practical point of view are available. On the other hand, it has been confirmed that there are a number of resist compositions which cannot achieve sufficient pattern resolution in liquid immersion lithography due to a change in their properties by the liquid, but which exhibit finer and higher resolving ability in ordinary lithography by exposure through a layer of air. Any of these resist compositions has been developed by expending significant development resources, and has various favorable resist properties, including transparency to the exposure light, developability and storage stability. The only disadvantage of these resist compositions is the lack of resistance to immersion liquid. Some examples of compositions which are not suitable for the liquid immersion lithography but achieve higher resolving ability in the lithography through a layer of air are shown in the Comparative Examples of the present invention described below.

Even for the aforementioned resist film intended for use in liquid immersion lithography, the quality and yield of non-defective products have been proven to be lower when the compositions are used in liquid immersion lithography than when used in common lithography in which the resist films are exposed via an air layer.

To evaluate the aforementioned requirements of conventional resist films for the liquid immersion lithography, the following analysis is conducted.

Specifically, for evaluating the formation of a resist pattern by liquid immersion lithography, it is considered to be necessary and sufficient to confirm three points: (i) the performance of the optical system in the liquid immersion lithography method, (ii) the effect of the resist film on the immersion liquid, and (iii) the change of properties of the resist film due to the immersion liquid.

(i) As clearly understood, for example, in the case of where is assumed where a photosensitive plate for photography, whose surface is water-proof, is immersed into water and a patterning light beam is irradiated onto the surface, there is in principle no doubt with respect to the point (i), that is the performance of an optical system, that no problem occurs if no light transmission loss occurs on the water surface and at the interface between the water and the surface of the photosensitive plate. In this case, light transmission loss may be easily solved by suitably correcting the incidence angle of the exposing light beam. Therefore, it is considered that any objects of exposure, for example, a resist film, a photographic sensitive plate, and an image screen, which are inert to the immersion liquid, namely, which are not affected by the immersion liquid, and which do not affect the immersion liquid, cause no change of the performance of the optical system. Thus, it is not necessary to further confirm this point or conduct any experiment on it.

(ii) The effect of the resist film on the immersion liquid specifically indicates that the component of the resist film is dissolved in the immersion liquid to change the refractive index of the liquid. Theoretically, when the refractive index of the immersion liquid changes, the optical resolution of the pattern exposure is sure to change and experiments are not necessary. In this point, it is enough to simply check whether the component of the resist film immersed in a liquid is dissolved in the liquid to change the formulation or refractive index of the immersion liquid, and it is not necessary to check resolving ability by actual irradiation of a pattern light and development.

Conversely, when the resist film immersed in the liquid is irradiated with a pattern light and developed to check resolving ability, it is possible to know as to whether resolving ability is excellent or poor, but it is difficult to judge whether resolving ability is affected by the change of the properties of the immersion liquid, the resist material, or both.

(iii) With respect to the phenomenon in which resolving ability is lowered by the change of properties of the resist film due to the immersion liquid, an evaluation test such as that in which "the resist film after exposure is showered with the immersion liquid and then developed, and the resultant resist pattern is examined in respect of resolving ability" is sufficiently evaluated. In this evaluation method, the resist film is directly showered with the liquid, and hence the conditions for immersion are very stringent. In this point, by the test in which the resist film completely immersed in the liquid is exposed, it is difficult to judge whether resolving ability is changed by the change of properties of the immersion liquid, the change of properties of the resist composition due to the immersion liquid, or by both.

The above phenomena (ii) and (iii) are two sides of the same coin, and may be figured out by identifying an alteration level of the resist film by the liquid.

Based on the results of the analysis, the suitability for liquid immersion lithography of the resist film currently proposed was evaluated by an evaluation test problem "the resist film after exposure is showered with the immersion liquid and then developed, and the resultant resist pattern is examined in respect of resolving ability." The suitability can also be evaluated by simulating the practical production process using a "two-beam interferometry exposure method" that includes using an interfered light caused by a prism as a pattern light for exposure and subjecting a sample immersed in a liquid to exposure.

As mentioned above, the production of new resist films suitable for use in liquid immersion lithography require significant development resources. However, it has been demonstrated that some of the conventional resist compositions that have been suggested has properties suitable for the liquid immersion lithography with or without slight modifications, although their quality may deteriorate to some degree. It has also been demonstrated that many resist films are susceptible to alteration and fail to provide sufficient pattern resolution due to immersion liquid in liquid immersion lithography, but such resist films can still be used in lithography by exposing through common air layer to form fine patterns with higher resolving ability.

The present invention has been made in view of such problems associated with conventional techniques. An objective of the present invention is to provide a technique enabling the application of the resist film obtained from conventional resist compositions, which have required many development resources to the liquid immersion lithography. More specifically, the objective of this invention is to enable the formation of a resist pattern with higher resolving ability using liquid immersion lithography by forming a specific preventive film on the surface of the conventional resist film so as to simultaneously prevent the deterioration of the resist film and that of the immersion liquid used during the liquid immersion lithography.

DISCLOSURE OF THE INVENTION

For solving the aforementioned problems, a material for forming a resist protective film used for the liquid immersion lithography process according to the present invention is a material for forming a resist protective film provided on a resist film so as to protect the resist film to be subjected to the liquid immersion lithography process. The material is characteristic in having no substantial solubility in water, and being alkali-soluble.

The method for forming a resist pattern of the present invention is a method for forming a resist pattern using a liquid immersion lithography process, wherein the method comprises: forming a photoresist film on a substrate; forming a protective film having the properties of being substantially insoluble in water but soluble in alkaline on the resist film; directly placing the liquid for liquid immersion lithography having a predetermined thickness at least on the protective film on the substrate having the resist film and the protective film layered thereon; irradiating the resist film with predetermined patterning light through the liquid for liquid immersion lithography and the protective film, and optionally subjecting the resultant resist film to heat treatment, washing the protective film and the resist film by using alkaline developer solution to remove the protective film, and simultaneously developing the resist film to obtain a resist pattern.

The liquid immersion lithography process preferably improves resist pattern resolution by exposing the resist film through the predetermined thickness of the liquid for the liquid immersion lithography, of which the refractive index larger than that of air and smaller than that of the resist film is intervened at least on the resist film in a path of the lithographic exposure light toward the resist film.

Furthermore, in the present invention, when forming the resist protective film, a specific fluorocarbon compound described below is preferably added as a component.

By using the material for forming a protective film according to the present invention, the protective film can be directly formed on the resist film so as not to interfere with the patterning light exposure. In addition, the material for forming the protective film of this invention is insoluble in water so as to enable the use of "water (pure water or deionized water) which is most likely to be the liquid used in liquid immersion lithography process because of the optical requirements of liquid immersion lithography, easy handling, and no risk in polluting the environment" as the actual liquid for immersion lithography process. In other words, even when water, which is easy to handle, has an excellent refractive index property and no risk of environmental pollution, is used as immersion liquid for the liquid immersion lithography process, the material for forming a protective file of the present invention sufficiently protects resist films of various compositions during the liquid immersion lithography process so that the resist patterns having excellent properties can be obtained. In addition, when the exposure light with a wavelength of 157 nm is used, a fluorine-containing medium is likely to be the liquid for liquid immersion lithography from the viewpoint of the exposure light absorption. Even when such a fluorine-containing solvent is used, as for the water mentioned above, it sufficiently protects the resist film during liquid immersion lithography process so that the resist pattern with excellent properties can be obtained. Furthermore, since the material for forming the protective film according to the present invention is alkali-soluble, it is unnecessary to remove the formed protective film from the resist film prior to the development process even when the light exposure is completed reaching the step of development process. That is, by using the protective film obtained using the material for forming the protective film according to the present invention, it is unnecessary to set up the step of removing the protective film prior to the development process after exposure such that the development process for the resist film with an alkaline developer solution can be performed as the protective film remains, so that the protective film removal and the resist film development are simultaneously accomplished. Therefore, the method for forming the pattern using the material for forming the protective film according to the present invention can efficiently perform the formation of the resist film with an excellent pattern property keeping the environmental pollution risk extremely low and reducing the number of processes.

As described above, in the present invention, when the protective film is formed, the specific fluorocarbon compound described below is preferably added. Addition of this specific fluorocarbon compound improves coating properties of the material for forming the resist protective film when the material is applied on the resist film as a coating solution. More importantly, when the protective film added with this specific fluorocarbon compound is used, resistance to post exposure delay in an atmosphere containing a small amount of amine after exposure can be improved.

This resistance to post exposure delay is briefly described as follows. The atmosphere of exposure and development processes for usual resists contains a minute quantity of amine in the order of ppb. It is known that when this amine comes in contact with the resist film after the exposure process, it causes distortion in the pattern dimension obtained by the subsequent development. When no significant distortion in the resist pattern dimension occurs by the subsequent development process even though the resist is exposed continuously to the atmosphere containing a small amount of amine after exposure, that resist has higher resistance to post exposure delay.

In the present invention, the protective film has a special property to protect the resist film after exposure from the amine action by adding a specific fluorocarbon compound described below thereto. This becomes one of the notable features of this invention.

In the present invention, the liquid immersion lithography can be performed by using water such as substantially pure water or deionized water, or a fluorine-containing inert liquid as a liquid for immersion lithography. As described above, considering of production cost, ease of post-treatment, low risk of environmental pollution and such, water is more preferable liquid for immersion lithography. However, when an exposure light of 157 nm wavelength is used, fluorine-containing solvent which absorbs less exposure light is preferably used.

The resist film used in the present invention includes any resist films obtained by using conventional resist compositions, without any limitations. This is the most notable feature of the present invention.

As described above, the essential characteristic as a protective film of the present invention substantially insoluble in water, alkali-soluble, and furthermore, is transparency to the exposure light, immiscibility in the resist film, superior adherence to the resist film, and excellent solubility in the developer solution. As a material capable of forming a protective film with such characteristics, a composition prepared by dissolving a specific fluoropolymer in a solvent in which the resist film cannot be dissolved and the fluoropolymer can be dissolved is used.

As a fluoropolymer which is the base polymer of the protective film of the present invention, a polymer having the following constitutional units is included in the concept of the polymer including water-insoluble and alkali-soluble constitutional units (X) containing an alicyclic group having both of (X-1): a fluorine atom or a fluoroalkyl group and (X-2): an alcoholic hydroxyl group or an oxyalkyl group.

Specifically, in the constitutional units (X), the aforementioned (X-1) and (X-2) are individually bonded to the alicyclic group in which the alicyclic group constitutes the principal chain. The aforementioned (X-1) is exemplified by the fluorine atom, or a fluorinated alkyl group, in which some or all of hydrogen atoms have been substituted with fluorine atoms in a lower alkyl group, respectively. Specific examples include a trifluoromethyl group, a pentafluoroethyl group, a heptafluoropropyl group, and a nonafluorobutyl group, and a fluorine atom and a trifluoromethyl group are preferable from an industrial point of view. The (X-2) is exemplified by a hydroxyl group alone, and a linear, branched or cyclic alkyloxyalkyl group or alkyloxy group with 1 to 15 carbon atoms.

The polymer (a12), which is a base polymer of the present invention, comprising such a unit is formed by cyclopolymerizing a diene compound having a hydroxyl group and a fluorine atom. The diene compound is preferably heptadiene, which easily form a polymer having a 5-membered ring or 6-membered ring exhibiting superior transparency and resistance to dry etching, and most preferably 1,1,2,3,3-pentafluoro-4-trifluoromethyl-4-hydroxy-1,6-heptadiene ($CF_2$=$CFCF_2C(CF_3)(OH)CH_2CH$=$CH_2$) for industrial use.

In the following, the general formula (100) representing the polymer is shown.

[Chemical formula 1]

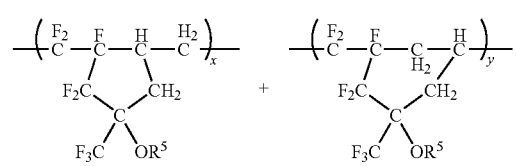

(100)

In the general formula (100), $R^5$ is a hydrogen atom or a linear, branched or cyclic $C_1$ to $C_{15}$ alkyloxy group or alkyloxyalkyl group, wherein x and y are 10 to 90 mole percent, respectively.

This type of polymer may be synthesized by a known method. The weight-average molecular weight of the resin as the polymer component based on polystyrene standard by way of GPC is not limited to special values but is preferably any value in the range from 5000 to 80000 and further preferably in the range from 8000 to 50000.

As a solvent dissolving the fluoropolymer, any solvents can be used so far as they are insoluble in the resist film and are capable of dissolving the fluoropolymer. Such solvents can be exemplified by alcoholic solvents, paraffinic solvents, fluorine-containing solvents, etc. As alcoholic solvents, the commonly used alcoholic solvents such as isopropyl alcohol, 1-hexanol, 2-methyl-1-propanol, and 4-methyl-2-pentanol are usable, 2-methyl-1-propanol and 4-methyl-2-pentanol are preferred in particular. It has been confirmed that as a paraffinic solvent, n-heptane, and as a fluorosolvent, perfluoro-2-butyltetrahydrofurane can be used. Among them, from the viewpoint of the alkali-solubility at the time of development process, alcoholic solvents are preferable.

As described above, to the material for forming a protective film according to the present invention is desirably added a fluorocarbon compound. This is because, even though, after the liquid immersion lithography process, the resist film stands in the atmosphere containing a small amount of amine prior to the development process, the undesirable influence of amine on the resist film can be suppressed by the presence of the protective film so as to produce no significant confusion in the dimension of the resist pattern obtained by the subsequent development process. Such fluorocarbon compounds shown below are not the subject to the significant new use rule (SNUR) and thus are usable.

As such fluorocarbon compounds, those represented by the following general formula (201)

$$(C_nF_{2n+1}SO_2)_2NH \tag{201}$$

in which n is an integer from 1 to 5;

the following general formula (202)

$$C_mF_{2m+1}COOH \tag{202}$$

in which m is an integer from 10 to 15;

the following general formula (203)

[Chemical formula 2]

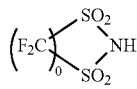
(203)

in which o is an integer from 2 to 3; and the following general formula (204),

[Chemical formula 3]

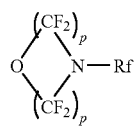
(204)

in which p is an integer from 2 to 3; Rf is an alkyl group partially or entirely substituted with fluorine atoms, or may be substituted with hydroxyl group, alkoxy group, carboxyl group and amino group, are preferable.

As a fluorocarbon compound represented by the general formula (201), specifically, the fluorocarbon compound represented by following chemical formula (205)

$$(C_4F_9SO_2)_2NH \tag{205}$$

or the following chemical formula (206)

$$(C_3F_7SO_2)_2NH \tag{206}$$

is preferable.

And, as a fluorocarbon compound represented by the general formula (202), specifically, the fluorocarbon compound represented by the following chemical formula (207) is preferable.

$$C_{10}F_{21}COOH \tag{207}$$

As a fluorocarbon compound represented by the general formula (203), specifically the fluorocarbon compound represented by the following chemical formula (208) is preferred.

[Chemical formula 4]

(208)

As a fluorocarbon compound represented by the general formula (204), specifically the fluorocarbon compound represented by the following chemical formula (209) is preferred.

[Chemical formula 5]

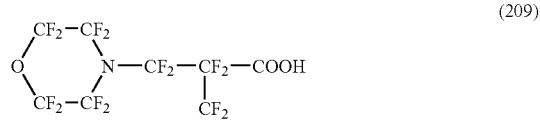
(209)

Since the protective film of the present invention is water-insoluble and highly resistant to other immersion liquid, it is applicable to the resist films of every possible composition including resist films with lower resistance to the immersion liquid. Therefore, as a resist film material of the present invention, any of the known resists including the commonly used positive type photoresist and negative type photoresist can be used. Actual examples of these resists are shown below.

First of all, the resin components used for the positive type photoresist include fluorinated resin, acrylic resin, cycloolefin resin, and silsesquioxane resin.

As a fluorine-containing resin, the polymer (A) composed of an alkali-soluble constitutional unit (a0-1) containing an alicyclic group having both of (i): a fluorine atom or fluorinated alkyl group and (ii): an alcoholic hydroxyl group or alkyloxy group in which alkali-solubility changes by acid action is preferable.

The aforementioned phrase, "alkali-solubility changes by acid action" means that the polymer changes in the light-exposed site. When the alkali-solubility increases at the light-exposed site, the light-exposed site becomes alkali-soluble so that the polymer can be used as a positive type resist film, while when the alkali-solubility decreases at the light-exposed site, the light-exposed site becomes alkali-insoluble so that the polymer can be used as a negative type resist film.

The alkali-soluble constitutional unit (a0-1) containing an alicyclic group having both of (i): a fluorine atom or a fluorinated alkyl group and (ii): an alcoholic hydroxyl group or alkyloxy group, may be any one provided that the organic group having both (i) and (ii) bonds to the alicyclic group, which is contained in the constitutional unit.

The alicyclic group is exemplified by a group, in which one hydrogen atom or a plurality of hydrogen atoms have been removed from monocyclic hydrocarbon or polycyclic hydrocarbon including cyclopentane, cyclohexane, bicycloalkane, tricycloalkane, tetracycloalkane. More specifically, the polycyclic hydrocarbon is exemplified by a group in which one hydrogen atom or a plurality of hydrogen atoms have been removed from a polycycloalkane including adamantane, norbornane, isobornane, tricyclodecane, and tetracyclododecane. Among these polycycloalkanes, a group derived by removing one hydrogen atom or a plurality of hydrogen atoms from cyclopentane, cyclohexane or norbornane, is preferable for industrial use.

The aforementioned (i) are exemplified by a fluorine atom and a group in which some or all of hydrogen atoms have been substituted with fluorine atoms in a lower alkyl group. Specific examples include a trifluoromethyl group, a pentafluoroethyl group, a heptafluoropropyl group, and a nonafluorobutyl group, and a fluorine atom and preferred is a trifluoromethyl group are preferable from an industrial point of view.

The aforementioned (ii) may be a hydroxyl group alone, or may be an alkyloxy group containing a hydroxyl group; an alkyloxy group containing an alcoholic hydroxyl group such as an alkyloxyalkyl group and alkyl group; an alkyloxyalkyl group containing an alcoholic hydroxyl group, and an alkyl group containing an alcoholic hydroxyl group. The alkyloxy group, the alkyloxyalkyl group, and the alkyl group are exemplified by a lower alkyloxy group, a lower alkyloxy-lower alkyl group and a lower alkyl group, respectively.

The lower alkyloxy group is specifically exemplified by a methyloxy group, an ethyloxy group, a propyloxy group and a butyloxy group; the lower alkyloxy-lower alkyl group is specifically exemplified by a methyloxymethyl group, an ethyloxymethyl group, a propyloxymethyl group, and a butyloxymethyl group, and the lower alkyl group is specifically exemplified by a methyl group, an ethyl group, a propyl group, and a butyl group.

Alternatively, the alkyloxy group containing an alcoholic hydroxyl group, the alkyloxyalkyl group containing an alcoholic hydroxyl group or the alkyl group containing an alcoholic hydroxyl group in the aforementioned (ii) includes an alkyloxy group, an alkyloxyalkyl group, and an alkyl group, in which some or all of the hydrogen atoms have been substituted with fluorine atoms respectively. Preferable examples include an alkyloxy group containing an alcoholic hydroxyl group, an alkyloxyalkyl group containing an alcoholic hydroxyl group, and an alkyl group containing an alcoholic hydroxyl group, in which some of the hydrogen atoms have been substituted with the fluorine atoms, namely, a fluoroalkyloxy group containing an alcoholic hydroxyl group, a fluoroalkyloxyalkyl group containing an alcoholic hydroxyl group, or a fluoroalkyl group containing an alcoholic hydroxyl group.

The fluoroalkyloxy group containing an alcoholic hydroxyl group is exemplified by a $(HO)C(CF_3)_2CH_2O$-group (2-bis(hexafluoromethyl)-2-hydroxy-ethyloxy group), a $(HO)C(CF_3)_2CH_2CH_2O$-group (3-bis(hexafluoromethyl)-3-hydroxy-propyloxy group). The fluoroalkyloxyalkyl group containing an alcoholic hydroxyl group is exemplified by a $(HO)C(CF_3)_2CH_2O$—$CH_2$-group, $(HO)C(CF_3))_2CH_2O$—$CH_2$-group, and the like. The fluoroalkyl group containing an alcoholic hydroxyl group is exemplified by a $(HO)C(CF_3)_2CH_2$-group (2-bis(hexafluoromethyl)-2-hydroxy-ethyl group), a $(HO)C(CF_3)_2CH_2CH_2$-group (3-bis(hexafluoromethyl)-3-hydroxy-propyl group), and the like.

These groups in the aforementioned (i) and (ii) may be directly bonded to the cycloaliphatic group. In particular, the unit (a0-1) is preferably a unit represented by the general formula (56) formed by bonding a fluoroalkyloxy group containing an alcoholic hydroxyl group, a fluoroalkyloxyalkyl group containing an alcoholic hydroxyl group, or a fluoroalkyl group containing an alcoholic hydroxyl group to a norbornane ring in which the double bond is cleaved, since it has due to superior transparency, alkali-solubility, and resistance to dry etching, and also is industrially readily available.

[Chemical formula 6]

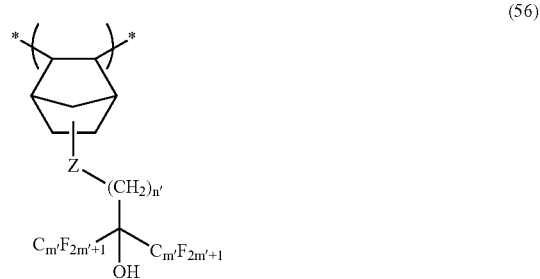

(56)

In the general formula (56), Z is an oxygen atom, an oxymethylene group (—O(CH$_2$)—), or a single bond; and n' and m' are independently any integer from 1 to 5.

Any of the polymer units used in combination with the unit (a0-1) may be known. When the polymer (A-1) in which the alkali-solubility increases by a positive type acid action, is used, the constitutional unit (a0-2), which is derived from (meth)acrylic acid ester containing a known acid dissociable, dissolution inhibiting group, is preferable because of its superior resolving ability.

The constitutional unit (a0-2) includes a constitutional unit derived from a tert-alkylester of (meth)acrylic acid such as tert-butyl methacrylate and tert-amyl methacrylate.

Alternatively, the polymer (A) may be a polymer (A-2), which further contains a fluorinated alkylene constitutional unit (a0-3) to improve transparency and increase the alkali-solubility by acid action. By including this type of constitutional unit (a0-3), the transparency may be further improved. The constitutional unit (a0-3) is preferably any one of the units derived from tetrafluoroethylene.

The general formulas (7) and (8) illustrating the polymer (A-1) and the polymer (A-2), respectively are shown below.

[Chemical formula 7]

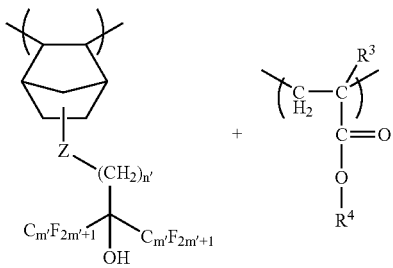

(57)

In the general formula (57), Z, n' and m' are the same as those defined in the general formula (56), $R^3$ is a hydrogen atom or a methyl group, and $R^4$ is an acid dissociable, dissolution inhibiting group.

[Chemical formula 8]

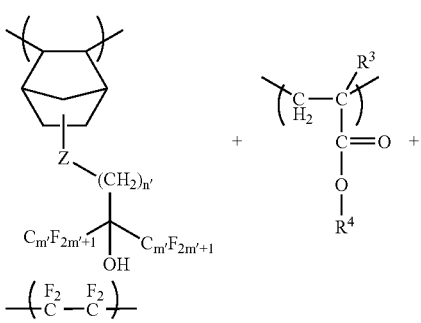

(58)

In the general formula (58), Z, n', m', $R^3$ and $R^4$ are the same as those defined in the general formula (57).

The polymers (A-1) and (A-2) contain the unit represented by the general formula (56); however, they have different constitutional formulas. These polymers may be those having any of the following constitutional units, which include an alkali-soluble constitutional unit (a0-1) containing both of the aforementioned (i) and (ii), and which is included in the concept of the polymer in which alkali-solubility changes by acid action.

Namely, in this type of constitutional unit (a0-1), the aforementioned (i) and (ii) are respectively bonded to the cycloaliphatic group, which constitutes a main chain. The aforementioned (i) include the same as those described above. The aforementioned (ii) is a hydroxyl group alone.

The polymer (A) having this type of unit is formed by cyclopolymerizing a diene compound having a hydroxyl group and a fluorine atom. The diene compound is preferably heptadiene, which tends to form a polymer having a 5-membered ring or 6-membered ring with higher transparency and resistance to dry etching. Industrially, a polymer formed by cyclopolymerizing 1,1,2,3,3-pentafluoro-4-trifluoromethyl-4-hydroxy-1,6-heptadiene ($CF_2$=$CFCF_2C(CF_3)(OH)$ $CH_2CH$=$CH_2$) is most preferable.

When the polymer (A-3), in which alkali-solubility increases by positive type acid action, is used, a polymer containing a constitutional unit (a0-4), in which a hydrogen atom of the alcoholic hydroxyl group has been substituted with the acid dissociable, dissolution inhibiting group, is preferable. The acid dissociable, dissolution inhibiting group is preferably a linear, branched, or cyclic alkyloxymethyl group with 1 to 15 carbon atoms in terms of acid dissociation and in particular, the lower alkoxymethyl group such as the methoxymethyl group is preferable because of higher resolving ability and superior pattern configuration. It should be noted that the amount of the acid dissociable, dissolution inhibiting group is preferably within the range from 10 to 40% and more preferably from 15 to 30% relative to the total hydroxyl groups to achieve a superior patter forming ability.

The general formula (59) illustrating the polymer (A-3) is shown below.

[Chemical formula 9]

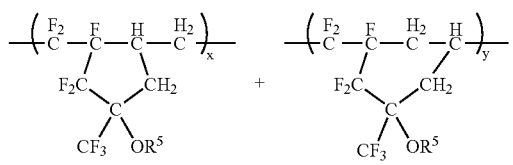

(59)

In the general formula (59), $R^5$ is a hydrogen atom or an alkyloxymethyl group with 1 to 15 carbon atoms; and x and y are 10 to 90 mol %, respectively.

This type of the polymer (A) may be synthesized by way of a known method. The weight-average molecular weight of the resin of the component (A) based on polystyrene standard by way of GPC is not limited to special values but is preferably any in the range from 5000 to 80000 and more preferably in the range from 8000 to 50000.

The polymer (A) may be composed of one type of resin or two or more of resins, for example, a mixture of two or more resins selected from the aforementioned (A-1), (A-2), and (A-3), and may further contain another conventionally known resin used for the photoresist compositions.

The acrylic resin is preferably a resin which has for example, the constitutional unit (a1) derived from (meth) acrylic acid ester containing the acid dissociable, dissolution inhibiting group and a constitutional unit derived from any (meth)acrylic acid ester other than that of the constitutional unit (a1) at 80 mol % or more, preferably 90 mol % or more (100 mol % is the most preferable) in these constitutional units.

The resin component is composed of a combination of a plurality of monomer units with different functions other than the unit (a1), for example, a combination of constitutional units listed below to satisfy higher resolving ability, resistance to dry etching, and fine pattern configuration.

Namely, the resin comprises a combination of constitutional units derived from a (meth)acrylic acid ester having lactone units (referred to as unit (a2) or (a2), hereinafter); constitutional units derived from a (meth)acrylic acid ester having an alcoholic hydroxyl group-containing polycyclic group (referred to as unit (a3) or (a3), hereinafter); and constitutional units containing a polycyclic group that differs from any of the acid dissociable, dissolution inhibiting groups of the unit (a1), the lactone unit of the unit (a2) and the alcoholic hydroxyl group-containing polycyclic group of the unit (a3) (referred to as unit (a4) or (a4), hereinafter).

These (a2), (a3), and/or (a4) units may be appropriately combined depending on the required characteristics or the like. The resin component preferably contains the unit (a1) and at least one unit selected from the units (a2), (a3) and (a4) to improve resolving ability and resist pattern configuration.

With respect to each of the units (a1) to (a4), a plurality of different units may be used in combination.

It is preferable that the constitutional unit derived from methacrylic acid ester and the constitutional unit derived from acrylic acid ester are used so that the constitutional unit derived from methacrylic acid ester is 10 to 85 mol %, preferably 20 to 80 mol % and the constitutional unit derived from acrylic acid ester is 15 to 90 mol %, preferably 20 to 80 mol % relative to the total mol % of the constitutional unit derived from methacrylic acid ester and the constitutional unit derived from acrylic acid ester.

The aforementioned units (a1) to (a4) are described in detail. The (a1) unit is a constitutional unit derived from (meth)acrylic acid ester having the acid dissociable, dissolution inhibiting group. This acid dissociable, dissolution inhibiting group in the unit (a1) is not particularly limited so far as it has alkali-solubility inhibiting ability which makes the entire resin component alkali-insoluble prior to exposure and dissociates by the generated acid action after exposure to alter the entire resin components to become alkali-soluble. Generally, a group forming a cyclic or linear tertiary alkyl ester with the carboxyl group of (meth)acrylic acid, a tertiary alkoxycarbonyl group or linear alkoxyalkyl group is widely known.

For example, the acid dissociable, dissolution inhibiting group containing an aliphatic polycyclic group is preferably used for the acid dissociable, dissolution inhibiting group as the unit (a1). Examples of the polycyclic groups include groups obtained by eliminating one hydrogen atom from a bicycloalkane, a tricycloalkane, a tetracycloalkane and such which may be unsubstituted or substituted with a fluorine atom or a fluoroalkyl group. Specifically, the polycycloalkane includes adamantane, norbornane, isobornane, tricyclodecane, and tetracyclodecane, from which one hydrogen atom has been removed. Such a polycyclic group can be appropriately selected from many groups proposed for ArF resist. Among these groups, the adamantyl group, norbornyl group, and tetracyclododecanyl group are industrially preferable.

Preferred monomer units for use as the unit (a1) are shown by the following general formulas (1) through (7). In the general formulas (1) to (7), R represents a hydrogen atom or a methyl group, $R_1$ represents a lower alkyl group, $R_2$ and $R_3$ independently represent a lower alkyl group, $R_4$ represents a tertiary alkyl group, $R_5$ represents a methyl group, and $R_6$ represents a lower alkyl group. The aforementioned $R_1$ to $R_3$, and $R_6$ are preferably linear or branched lower alkyl groups having 1 to 5 carbon atoms, and exemplified by a methyl group, an ethyl group, a propyl group, an isopropyl group, an n-butyl group, an isobutyl group, a tert-butyl group, a pentyl group, an isopentyl group, and a neopentyl group. A methyl group or an ethyl group is preferable for industrial use. $R_4$ is a tertiary alkyl group such as a tert-butyl group or a tert-amyl group and a tert-butyl group is preferable for industrial use.

[Chemical formula 10]

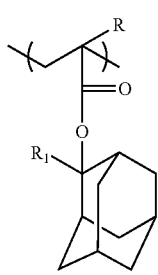

(1)

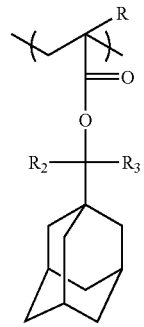

(2)

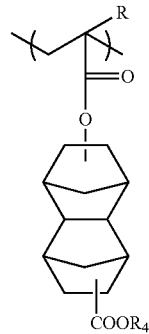

(3)

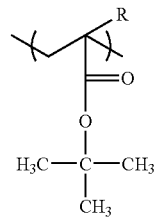

(4)

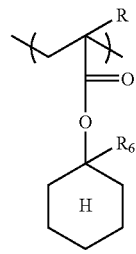

(5)

[Chemical formula 11]

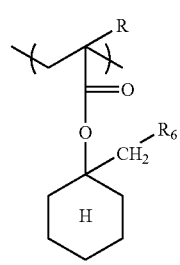

(6)

-continued (7)
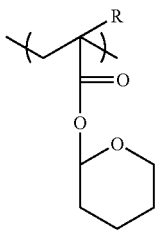

As the unit (a1) among those cited above, the constitutional units represented by the general formulas (1), (2), and (3) are particularly preferred to form patterns with high transparency, higher resolving ability, and superior resistance to dry etching.

The (a2) unit, which has a lactone unit, is useful for improving hydrophilicity to the developer solution. Any of units which have the lactone unit and can be copolymerized with any other constitutional unit of the resin component may be used for the unit (a2). For example, the monocyclic lactone unit includes a group in which one hydrogen atom has been removed from γ-butyrolactone. The polycyclic lactone unit includes a group in which one hydrogen atom has been removed from polycycloalkane containing lactone.

Monomer units represented by the general formulas (10) to (12) shown below are preferred as (a2). In these general formulas, R is a hydrogen atom or a methyl group.

[Chemical formula 12]

(10)
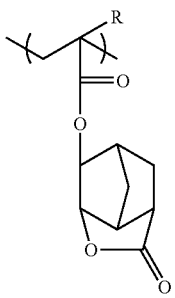

(11)
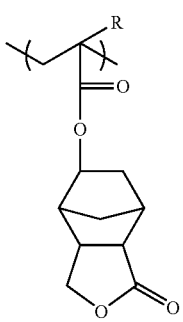

-continued

(12)
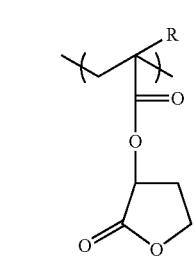

A (meth)acrylic acid γ-butyrolactone ester having an ester linkage at the α-carbon represented by the general formula (12) above and a (meth)acrylic acid norbornane lactone ester represented by the general formula (10) or (11) are especially preferred since they are easily commercially available.

The unit (a3) is a constitutional unit derived from (meth) acrylic acid ester having a polycyclic group containing an alcoholic hydroxyl group. The hydroxyl group in the polycyclic group containing the alcoholic hydroxyl group is a polar group and therefore, the use of this hydroxyl group improves the hydrophilicity of the entire resin component to the developer solution, enhancing the alkali-solubility at the light-exposed site. Accordingly, it is preferable that the resin components have the unit (a3), which improves resolving ability. The polycyclic group in the unit (a3) may be selected from the same aliphatic polycyclic groups as those exemplified in the description of the unit (a1) and used.

Any group may be used with no particular limitation for the polycyclic group containing the alcoholic hydroxyl group in the unit (a3) and, for example, an adamantyl group containing a hydroxyl group or the like may be preferably used. Furthermore, this adamantyl group containing a hydroxyl group is preferably one represented by the general formula (13) shown below since it has an effect of improving the resistance to dry etching and the squareness of the cross-sectional configuration of the pattern. In the general formula (13), l is an integer from 1 to 3.

[Chemical formula 13]

(13)
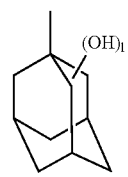

Any unit which has the polycyclic group containing the alcoholic hydroxyl group as described above and may copolymerize with any other constitutional unit of the resin component may be used for the unit (a3). Specifically, constitutional units represented by the general formula (14) shown below are preferred. In the general formula (14), R represents a hydrogen atom or a methyl group.

[Chemical formula 14]

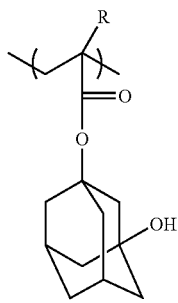
(14)

In the unit (a4), the polycyclic group "different from the acid dissociable, dissolution inhibiting group, the lactone unit, and the polycyclic group containing alcoholic hydroxyl group" means that the polycyclic group in the unit (a4) in the resin component overlaps none of the polycyclic groups containing the acid dissociable, dissolution inhibiting group in the unit (a1), the lactone unit in the unit (a2), and the polycyclic group containing alcoholic hydroxyl group in the unit (a3), and that units (a4) have none of the polycyclic groups containing the acid dissociable, dissolution inhibiting group in units (a1), the lactone unit in units (a2), and the alcoholic hydroxyl group in units (a3) that constitute the resin component.

There is no limitation for a polycyclic group of the unit (4) in one resin component, as far as it is selected not to overlap the units (a1) to (a3). For example, the same aliphatic polycyclic group as the unit exemplified as the unit (a1) may be used for the polycyclic group of the unit (a4) and any of many constitutional units that are conventionally known as an ArF positive resist material may be selected. In particular, it is preferable that at least one or more groups are selected from the tricyclodecanyl group, adamantyl group, and tetracyclododecanyl group because they are easily industrially available. Any unit may be used for the unit (a4) without any limitation as far as it has the polycyclic group as described above and can be copolymerized with any other constitutional unit of the resin component.

Preferred examples of (a4) are represented by the general formulas (15) to (17) below. In these general formulas, R is a hydrogen atom or a methyl group.

[Chemical formula 15]

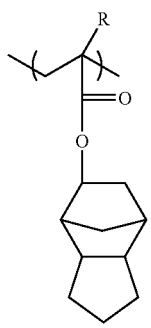
(15)

-continued

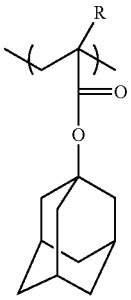
(16)

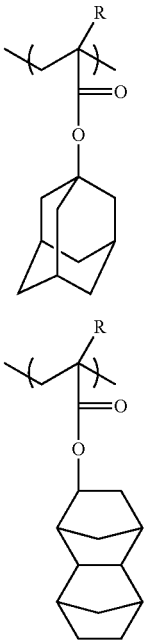
(17)

It is preferable that the unit (a1) is 20 to 60 mol %, preferably 30 to 50 mol % relative to the total of the constitutional units of the resin component because of superior resolving ability. It is preferable that the unit (a2) is 20 to 60 mol %, preferably 30 to 50 mol % relative to the total of the constitutional units of the resin component because of superior resolving ability. Moreover, it is preferable that the (a3) unit is 5 to 50 mol %, preferably 10 to 40 mol % relative to the total of the constitutional units of the resin component because of superior resist pattern configuration. Furthermore, it is preferable that the (a4) unit is 1 to 30 mol %, preferably 5 to 20 mol % because of superior resolving ability from isolated patterns to semi-dense patterns.

Although the unit (a1) and at least one unit selected from the units (a2), (a3) and (a4) can be appropriately combined in accordance with the intended purpose, a terpolymer composed of the units (a1), (a2), and (a3) is preferred because of the superior resist pattern configuration, exposure margin, resistance to heat, and resolving ability. In this case, the preferable contents of the constitutional units (a1) to (a3) are 20 to 60 mol % for (a1), 20 to 60 mol % for (a2), and 5 to 50 mol % for (a3), respectively.

Although the weight-average molecular weight (hereafter based on polystyrene standard) of the resin component for use in the present invention are not particularly limited, it is preferably in the range of 5000 to 30000 and more preferably, in the range of 8000 to 20000.

Values larger than this range may deteriorate the solubility of the resin component into the resist solvent, while smaller values may adversely affect the resistance to dry etching and the cross sectional configuration of resist pattern.

The cycloolefin resin is preferably a resin comprising the constitutional unit (a5) represented by the general formula (18) shown below, which are optionally copolymerized with the constitutional units obtained from (a1) as necessary.

[Chemical formula 16]

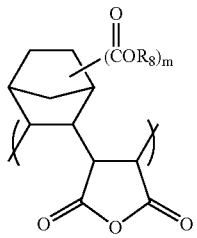
(18)

In this formula, $R_8$ is a substitute exemplified as an acid dissociable, dissolution inhibiting group in the unit (a1), and m is an integer from 0 to 3. In the case in which m is 0 in the unit (a5), the unit (a5) is preferably used as a copolymer having the unit (a1).

Examples of the silsesquioxane resins include resins having the constitutional unit (a6) represented by the general formula (19) shown below, and the constitutional units (a7) represented by the general formula (20) shown below.

[Chemical formula 17]

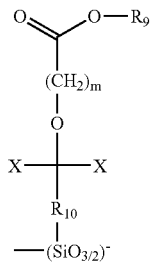
(19)

In the general formula, $R_9$ is an acid dissociable, dissolution inhibiting group comprising an aliphatic monocyclic or polycyclic hydrocarbon group; $R_{10}$ is a linear, branched, or cyclic saturated aliphatic hydrocarbon group: X is an alkyl group having 1 to 8 carbon atoms in which at least one hydrogen atom substituted with a fluorine atom; and m is an integer from 1 to 3.

[Chemical formula 18]

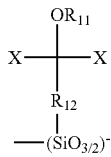
(20)

In the general formula, $R_{11}$ is a hydrogen or linear, branched, or cyclic alkyl group; $R_{12}$ is a linear, branched, or cyclic saturated aliphatic hydrocarbon; X is an alkyl group having 1 to 8 carbon atoms in which at least one hydrogen atom substituted with a fluorine.

In the aforementioned (a6) and (a7), the acid dissociable, dissolution inhibiting group represented by $R_9$ is a group, which has an alkali-solubility inhibitive property so as to make all the silsesquioxane resin components alkali-insoluble prior to the lithography process, and dissociates the silsesquioxane resin components by the action of an acid produced from the acid generator after the lithography process, thereby making all the silsesquioxane resin alkali-soluble. Examples of such acid dissociable, dissolution inhibiting groups include those represented by the general formulas (21) to (25) below having hydrocarbon groups containing a bulky aliphatic monocyclic or polycyclic group. The use of this acid dissociable, dissolution inhibiting group makes the dissociated dissolution inhibiting group difficult to gasify, preventing the group from undergoing degasifying phenomena.

[Chemical formula 19]

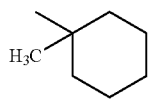
(21)

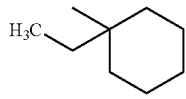
(22)

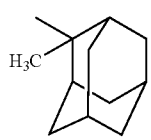
(23)

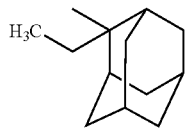
(24)

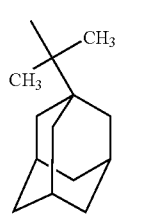
(25)

$R_9$ preferably has 7 to 15 carbon atoms, more preferably 9 to 13 carbon atoms unlikely to produce gas upon dissociation and ensure proper solubility in the resist solvent and the developer solution.

The acid dissociable, dissolution inhibiting group may be selected from, for example, many kinds of resin components proposed for a resist composition for ArF excimer laser depending on the light source to be used as long as it is composed of the hydrocarbon group containing an aliphatic monocyclic or polycyclic group. Generally, the acid dissociable, dissolution inhibiting group, which forms tertiary alkyl ester with the carboxyl group of (meth)acrylic acid is widely known.

In particular, the acid dissociable, dissolution inhibiting group containing an aliphatic polycyclic group is preferable. The aliphatic polycyclic group may be appropriately selected from many groups proposed for the ArF resist. For example, the aliphatic polycyclic group includes a group in which one hydrogen atom has been removed from bicycloalkane, tricycloalkane, tetracycloalkane, and such, more specifically, polycycloalkane including adamantane, norbornane, isobornane, tricyclodecane, tetracyclododecane, and such.

Among the aforementioned general formulas, the silsesquioxane resins having a 2-methyl-2-adamantyl group represented by the general formula (23) and/or a 2-ethyl-2-adamantyl group represented by the general formula (24) are preferred since they are unlikely to cause degasification and have excellent resist properties including resolving ability and heat resistance.

Each of $R_{10}$ and $R_{11}$ has preferably 1 to 20, more preferably 5 to 12 carbon atoms from the viewpoint of enabling to control solubility in the resist solvent and the molecular size. In particular, the cyclic saturated aliphatic hydrocarbon group, which has an advantage in that the obtained silsesquioxane resin has high transparency to high energy light, a high glass transition point (Tg) to easily control the acid generation from an acid generator during PEB (Post-Exposure-Baking), is preferable.

The cyclic saturated aliphatic hydrocarbon group may be a monocyclic group or a polycyclic group. The polycyclic group may be exemplified by a group in which two hydrogen atoms have been removed from bicycloalkane, tricycloalkane, and tetracycloalkane, more specifically, adamantane, norbornane, isobornane, tricyclodecane, and tetracyclododecane.

More specific examples of $R_{10}$ and $R_{12}$ include those groups obtained by eliminating two hydrogen atoms from respective alicyclic compounds represented by the general formulas (26) to (31) shown below or derivatives thereof.

[Chemical formula 20]

 (26)

 (27)

 (28)

 (29)

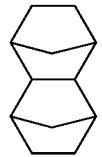 (30)

 (31)

The derivatives mean the alicyclic compounds of the chemical formulas (26) to (31) above having at least one hydrogen atom substituted with a group, e.g., a lower alkyl group such as a methyl group or an ethyl group; an oxygen atom; or a halogen atom such as fluorine, chlorine, or bromine. Among these, a group obtained by eliminating two hydrogen atoms from an alicyclic compound selected from the group consisting of the chemical formulas (26) to (31) is preferable since it has high transparency and is easily industrially available.

In addition, $R_{11}$ is preferably a lower alkyl group with 1 to 10 carbon atoms, and preferably 1 to 4 carbon atoms in terms of solubility in the resist solvent.

More specifically, this type of alkyl group is exemplified by a methyl group, ethyl group, propyl group, isopropyl group, n-butyl group, sec-butyl group, tert-butyl group, cyclopentyl group, cyclohexyl group, 2-ethylhexyl group, an n-octyl group, etc.

$R_{11}$ is appropriately selected from the aforementioned candidates depending on the desired alkali-solubility of the silsesquioxane resin. When $R_{11}$ is a hydrogen atom, alkali-solubility reaches the highest level. Higher alkali-solubility has the advantage that sensitivity further improves.

On the other hand, as the number of the carbon atoms of the alkyl group increases, or as the alkyl group becomes more bulky, the alkali-solubility of the silsesquioxane resin deteriorates. As alkali-solubility deteriorates, resistance to the alkaline developer solution improves and therefore, a lithographic margin may be enhanced in forming the resist patterns using the silsesquioxane resin and a variation in size involved in light exposure reduces. Furthermore, unevenness in development may be eliminated, and roughness in the edges of the formed resist patterns is improved.

In the general formulas (19) and (20), X is preferably a linear alkyl group, in particular. A lower alkyl group with 1 to 8 carbon atoms is preferably, and a lower group with 1 to 4 carbon atoms are more preferably in terms of the glass transition point (Tg) of the silsesquioxane resin and solubility in the resist solvent. The alkyl group preferably has hydrogen atoms as many as possible for being substituted with fluorine atoms since the transparency to high-energy light or electron beam of 200 nm or shorter is improved, and the alkyl group is most preferably a perfluoroalkyl group in which all the hydrogen atoms are substituted with fluorine atoms. Each X may be the same or different from each other. In the general formula (19), m may be an integer of 1 to 3, preferably 1 to easily dissociate the acid dissociable, dissolution inhibiting group More specific examples of the silsesquioxane resins include those resins represented by the general formula (32) or (33) shown below.

[Chemical formula 21]

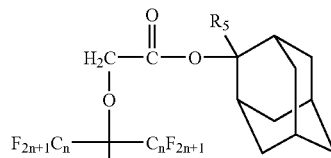 (32)

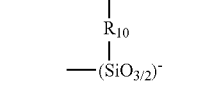 (33)

In the formulas, $R_5$, $R_{10}$, $R_{12}$, and n are those as defined above.

The constitutional units (a6) and (a7) typically compose 30 to 100 mol %, preferably 70 to 100 mol %, more preferably 100 mol % of the entire constitutional unit forming the silsesquioxane resin of the present invention.

The ratio of the constitutional unit (a6) to the total of the constitutional units (a6) and (a7) is preferably 5 to 70 mol % and more preferably 10 to 40 mol %. The ratio of the constitutional unit (a7) is preferably 30 to 95 mol % and more preferably 60 to 90 mol %.

By setting the ratio of the constitutional unit (a6) within the aforementioned range, the ratio of the acid dissociable, dissolution inhibiting group is automatically determined and therefore, the change of the alkali-solubility of the silsesquioxane resin before and after exposure becomes suitable for the base resin for the positive type resist composition.

The silsesquioxane resin may have any constitutional units other than the constitutional units (a6) and (a7) to the extent that they are not detrimental to the effects of the present invention. Examples thereof include those units used in a silsesquioxane resin for ArF excimer laser resist compositions, e.g., alkylsilsesquioxane units represented by the general formula (34) shown below, having an alkyl group (R'), such as a methyl group, an ethyl group, a propyl group, or a butyl group.

[Chemical formula 22]

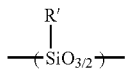

(34)

The weight-average molecular weight (Mw) of the silsesquioxane resins (based on polystyrene standard by way of gel permeation chromatography) is not in particular limited but is preferably any value of 2000 to 15000 and more preferably any value of 3000 to 8000. A value above this range deteriorates the solubility in the resist solvent; while a smaller value may make the cross sectional configuration of the resist pattern poorer.

In addition, weight-average molecular weight (Mw)/number-average molecular weight (Mn), namely the degree of polymer dispersion is not in particular limited but is preferably any value of 1.0 to 6.0 and more preferably any value of 1.5 to 2.5. A value above this range may deteriorate resolving ability and pattern configuration.

Having the silsesquioxane backbone composed of the constitutional units (a6) and (a7), the silsesquioxane resin of the present invention has high transparency to high energy light of 200 nm or shorter wavelengths and electron beams. Therefore, the positive type resist composition containing the silsesquioxane resin in the present invention is advantageously used in lithography using a light source at a wavelength shorter than that of, e.g., an ArF excimer laser, and, particularly in a single-layer process, the resist composition can form a fine resist pattern having a line width as small as 150 nm or less, and further 120 nm or less. In addition, the positive type resist composition may be used for an upper layer of a double-layer resist laminated body so as to be useful in the process of forming finer resist patterns with line widths less than or equal to 120 nm and furthermore less than or equal to 100 nm.

The resin component for use in the negative type resist composition is not particularly limited, but specifically it is preferably a resin component as described below.

As such a resin component, the resin (a8), a resin component having two kinds of functional groups in one molecule which may intramolecularly react to form an ester through dehydration by acid action generated from the acid generator added simultaneously to the resist material, thereby making the resin component become alkali-insoluble, is preferably used. The "two kinds of functional groups in one molecule which may intramolecularly react to form an ester" described herein refers to groups, for example, hydroxyl groups, and carboxyl groups or carboxylic acid ester or the like, for forming a carboxylic acid ester. In other words, these groups are two kinds of functional groups for forming an ester. As such resins, for example, resins, which have the hydroxyalkyl group and at least one of the carboxyl group and carboxylic acid ester group in the side chain of the main resin skeleton, are preferable. In addition, as the resin components, the resin component (a9), which is composed of a polymer having a dicarboxylic acid monoester unit, is also preferable.

In other words, (a8) is a resin component having at least constitutional units represented by the following general formula (35) shown below.

[Chemical formula 23]

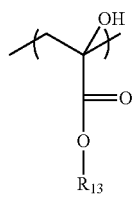

(35)

In this formula, $R_{13}$ is a hydrogen, alkyl group having 1 to 6 carbon atoms, or alkyl group having a polycyclic ring structure, such as bornyl group, adamantyl group, tetracyclododecyl group and tricyclodecyl group.

Preferred examples of such resins include polymers (homopolymers or copolymers) (a8-1) comprised of at least one type of monomers selected from an α-(hydroxyalkyl)acrylic acid and an α-(hydroxyalkyl)acrylic acid alkyl ester, and copolymers (a8-2) comprised of at least one type of monomer selected from an α-(hydroxyalkyl)acrylic acid and an α-(hydroxyalkyl)acrylic acid alkyl ester and at least one type of monomer selected from another ethylenically unsaturated carboxylic acid and ethylenically unsaturated carboxylate.

The polymers (a8-1) preferably include copolymers of an α-(hydroxyalkyl)acrylic acid and an α-(hydroxyalkyl)acrylic acid alkyl ester, and, the copolymers (a8-2) preferably include copolymers that contain, as another ethylenically unsaturated carboxylic acid or ester of another ethylenically unsaturated carboxylate, at least one member selected from acrylic acid, methacrylic acid, an acrylic acid alkyl ester, and an methacrylic acid alkyl ester.

Examples of the hydroxyalkyl group in the α-(hydroxyalkyl)acrylic acid and the α-(hydroxyalkyl)acrylic alkyl ester may include lower hydroxyalkyl groups such as hydroxymethyl, hydroxyethyl, hydroxypropyl and hydroxybutyl groups. Among these groups, the hydroxyethyl group and the hydroxymethyl group are preferably used to easily form ester.

Examples of the alkyl groups in the alkyl ester portion of the α-(hydroxyalkyl)acrylic acid alkyl ester include lower alkyl groups, such as a methyl group, an ethyl group, a propyl group, an isopropyl group, an n-butyl group, a sec-butyl group, a tert-butyl group, and an amyl group; and bridged polycyclic hydrocarbon groups, such as a bicyclo[2.2.1]heptyl group, a bornyl group, an adamantyl group, a tetracyclo[4.4.0.1$^{2.5}$0.1$^{7.10}$]dodecyl group, and a tricyclo[5.2.1.0$^{2.6}$]decyl group. If the alkyl group in the ester portion has the polycyclic hydrocarbon group, resistance to dry etching is effectively improved. Among these alkyl groups, in particular, lower alkyl groups, which are inexpensive components and easily available as an alcohol component to form ester, including the methyl group, the ethyl group, the propyl group, and the butyl group are preferably used.

When any of lower alkyl esters is used, an esterification occurs with the hydroxyalkyl group as well as in the carboxyl group, while such an esterification does not readily occur when an ester is formed with the cross-linked polycyclic hydrocarbon. For this reason, when an ester of the cross-linked polycyclic hydrocarbon is introduced into the resin component, it is preferable that the carboxyl group is simultaneously connected to the side chain of the resin.

On the other hand, examples of other ethylenically unsaturated carboxylate or ethylenically unsaturated carboxylic acid esters in (a8-2) include unsaturated carboxylic acids such as acrylic acid, methacrylic acid, maleic acid, and fumaric acid; and alkyl esters such as methyl, ethyl, propyl, isopropyl, n-butyl, isobutyl, n-hexyl and octyl ester of these unsaturated carboxylic acids.

For the alkyl group at the ester portion, acrylic acid esters or methacrylic acid esters having the cross-linked polycyclic hydrocarbon groups may be used including a bicyclo[2.2.1] heptyl group, a bornyl group, an adamantyl group, a tetracyclo[4.4.0.1$^{2.5}$0.1$^{7.10}$]dodecyl group, and tricyclo[5.2.1.0$^{2.6}$] decyl group. Among these alkyl groups, acrylic acid and methacrylic acid or their lower alkyl esters including methyl, ethyl, propyl, and n-butyl esters are preferably used.

In the resin component (a8-2), the molar ratio of at least one type of monomer unit selected from an α-(hydroxyalkyl)acrylic acid and an α-(hydroxyalkyl)acrylic acid alkyl ester relative to at least one type of monomer unit selected from another ethylenically unsaturated carboxylic acid and an ethylenically unsaturated carboxylic acid ester is preferably in the range of from 20:80 to 95:5, especially preferably 50:50 to 90:10. If the ratio between the monomer units is within the aforementioned range, ester may be easily formed in a molecule or between molecules, achieving superior resist patterns.

The resin component (a9) is a resin component having at least constitutional units represented by the following general formula (36) or (37).

[Chemical formula 24]

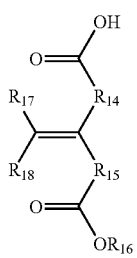

(36)

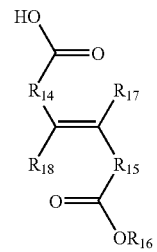

-continued (37)

In the formulas, $R_{14}$ and $R_{15}$ are each alkyl chains having 0 to 8 carbon atoms; $R_{16}$ is a substituent having at least two alicyclic structures; and $R_{17}$ and $R_{18}$ are a hydrogen atom or an alkyl group having 1 to 8 carbon atoms.

The negative type resist composition using a resin component having this type of dicarboxylic acid monoester monomer unit is preferably used because of higher resolving ability and reduced line edge roughness. This composition, which has resistance to swelling, is more preferably used in the liquid immersion lithography process. These dicarboxylic acid monoester compounds include fumaric acid, itaconic acid, mesaconic acid, glutaconic acid, and traumatic acid monoesters.

Preferred examples of resins having the dicarboxylic acid monoester units include polymers or copolymers (a9-1) comprised of dicarboxylic acid monoester monomers, and copolymers (a9-2) comprised of dicarboxylic acid monoester monomers and at least one type of monomer selected from the α-(hydroxyalkyl)acrylic acid, α-(hydroxyalkyl)acrylic acid alkyl ester, another ethylenically unsaturated carboxylic acid, and another ethylenically unsaturated carboxylate. The resin components of the negative type resist may be used either individually or in combination of two or more thereof. The weight-average molecular weight of the resin component is any (value) of 1000 to 50000 and preferably any (value) of 2000 to 30000.

Among the resins, the positive type resists using the acrylic resin ((a1) to (a4)) are the positive type resists containing the resins with relatively high resistance to liquid immersion, but as the size becomes closer to limit resolution size in liquid immersion lithography, pattern resolution tends to deteriorate. The cause of lowering resolving ability is not limited to a single factor, and, for removing such factors, it is considerably effective to completely separate the immersion liquid from the resist film by forming the protective film of the present invention.

A positive type resist that includes the silsesquioxane resin ((a6) and (a7)) or the negative type resist that includes the specific resins (a8) and/or (a9) is considered to have poor liquid immersion resistance, as compared to the positive type resist using the aforementioned acrylic resin, and the suitability of this resist for liquid immersion lithography can be improved by using the protective film of the present invention.

Furthermore, when the cycloolefin resin is used as seen in the Comparative Example, it is known that a resist that includes the cycloolefin resin has a very poor liquid immersion lithography resistance, which makes it impossible to form a pattern.

Even a positive type resist containing such a resin can be applied to liquid immersion lithography by using the protective film of the present invention.

Furthermore, for the acid generators combined with the resin compositions for the aforementioned positive type resists or negative type resists, any one may be selected from the known acid generators for chemically amplified resists.

Actual examples of the acid generators include onium salts, such as diphenyliodonium trifluoromethane sulfonate, (4-methoxyphenyl)phenyliodonium trifluoromethane sulfonate, bis(p-tert-butylphenyl)iodonium trifluoromethane sulfonate, triphenylsulfonium trifluoromethane sulfonate, (4-methoxyphenyl)diphenylsulfonium trifluoromethane sulfonate, (4-methylphenyl)diphenylsulfonium trifluoromethane sulfonate, (4-methylphenyl)diphenylsulfonium nonafluorobutane sulfonate, (p-tert-butylphenyl)diphenylsulfonium trifluoromethane sulfonate, diphenyliodonium nonafluorobutane sulfonate, bis(p-tert-butylphenyl)iodonium nonafluorobutane sulfonate, triphenylsulfonium nonafluorobutane sulfonate, (4-trifluoromethylphenyl)diphenylsulfonium trifluoromethane-sulfonate, (4-trifluoromethylphenyl)diphenylsulfonium nonafluorobutane-sulfonate, and tri(p-tert-butylphenyl)sulfonium trifluoromethane sulfonate.

Among the onium salts, a triphenylsulfonium salt, which does not readily decompose and produce organic gases, is preferable. The blending amount of the triphenylsulfonium salt is preferably 50 to 100 mol %, more preferably 70 to 100 mol %, and most preferably 100 mol % relative to the total amount of the acid generator.

Among the triphenylsulfonium salts, a triphenylsulfonium salt represented by the general formula (38) shown below having a perfluoroalkylsulfonic acid ion as an anion is especially preferably used since high sensitivity can be achieved.

[Chemical formula 25]

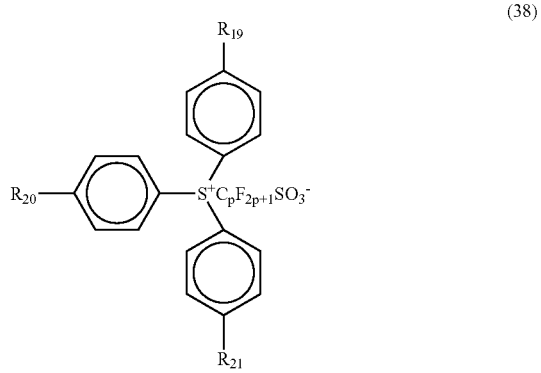

(38)

In the formula, each of $R_{19}$, $R_{20}$, and $R_{21}$ independently represents a hydrogen atom, a lower alkyl group having 1 to 8, preferably 1 to 4 carbon atoms, or a halogen atom, such as chlorine, fluorine, or bromine; and p is an integer of 1 to 12, preferably 1 to 8, and more preferably 1 to 4.

The aforementioned acid generators may be used alone or by combining two or more kinds thereof. The blending amount of the acid generator is 0.5 parts by mass and preferably 1 to 10 parts by mass relative to 100 parts by mass of the aforementioned resin components. At less than 0.5 parts by mass, pattern formation is not satisfactorily performed, while at more than 30 parts by mass, a homogeneous solution is difficult to prepare, so that storage stability is likely to deteriorate.

The positive or negative type resist compositions of the present invention are produced by dissolving the resin component, the acid generator, and the optional components described below preferably in an organic solvent.

For the organic solvent, any organic solvent may be used with no particular limitation which can dissolve the resin components and the acid generator to make the solution homogeneous may be used and any one, two or more solvents may be appropriately used by selecting from the known solvents for chemically amplified conventional resists.

Examples of the organic solvents include ketones, such as acetone, methyl ethyl ketone, cyclohexanone, methyl isoamyl ketone, and 2-heptanone; polyalcohols and derivatives thereof, such as ethylene glycol, ethylene glycol monoacetate, diethylene glycol, diethylene glycol monoacetate, propylene glycol, propylene glycol monoacetate, dipropylene glycol, or monomethylether, monoethylether, monopropylether, monobutylether, or monophenylether of dipropylene glycol monoacetate; cyclic ethers, such as dioxane; and esters, such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used alone or in combinations of two or more kinds thereof.

In these positive or negative type resists, a known amine, preferably a secondary lower aliphatic amine, a tertiary lower aliphatic amine, or the like and organic acids, such as organic carboxylic acid and phosphorous oxo acid may be added as a quencher to improve resist pattern configuration, temporal stability, etc.

The lower aliphatic amine includes the amines of alkyl or alkyl alcohol with 5 or less carbon atoms, and examples of secondary amine and tertiary amine include trimethylamine, diethylamine, triethylamine, di-n-propylamine, tri-n-propylamine, tripentylamine, diethanolamine, and triethanolamine and in particular, alkanolamine such as triethanolamine is preferably used. These amines may be used alone or in combinations of two kinds or more thereof. These amines are usually used in any in the range from 0.01 to 2.0% by mass relative to the resin component.

Suitable examples of the organic carboxylic acids include malonic acid, citric acid, malic acid, succinic acid, benzoic acid, and salicylic acid.

The phosphorous oxo acid or its derivatives include phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, such as phosphinic acid and phenylphosphinic acid. Among them, phosphonic acid is preferable in particular.

The organic acid is used in a ratio of 0.01 to 5.0 parts by mass relative to 100 parts by mass if the resin component. These may be used alone or in combination of two kinds or more thereof. These organic acids are preferably used in a molar range equal to or lower than that of the amine.

If desired, the positive type resist composition of the present invention may further contain miscible additives, such as additional resins for improving the performance of the resist film, surfactants for improving the coating property, anti-dissolving agents, plasticizers, stabilizers, coloring agents, and anti-halation agents.

If necessary, the negative type resist composition of the present invention may further contain a crosslinking agent for increasing crosslink density and improving resist pattern configuration, resolving ability, and resistance to dry etching.

For this crosslinking agent, any known crosslinking agent, which is commonly used in the chemically amplified negative type resists, may be used with no special limitation. Examples thereof include aliphatic cyclic hydrocarbons having hydroxyl group or hydroxyalkyl group or both, or oxygen-containing derivatives thereof, such as 2,3-dihydroxy-5-hydroxymethylnorbornane, 2-hydroy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane; and compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, and among these, tetrabutoxymethyl glycoluril being particularly preferred. These crosslinking agents may be used alone or in combinations of two or more kinds thereof.

Next, the method of forming resist patterns using the protective film of the present invention in the liquid immersion lithography process will be described. First, a commonly used resist composition is applied onto a substrate such as a silicon wafer with a spinner or the like, and then the substrate is pre-baked (PAB process). Alternatively, a two-layer laminated body with an organic or inorganic antireflection film laid between the substrate and the coated layer of the resist composition may also be used.

The process up to this stage may be performed by known methods. It is preferable that the operating conditions and such are appropriately set depending on the constitution and characteristics of the resist composition to be used.

Next, to the surface of the resist film (monolayered or multilayered) cured as described above, a composition of material for forming the protective film according to the present invention, for example, a "composition prepared by dissolving a cyclic fluoroalcohol polymer represented by the following chemical formula (100) shown below in 2-methyl-1-propylalcohol" is evenly applied and cured so as to form a resist protective film.

[Chemical formula 26]

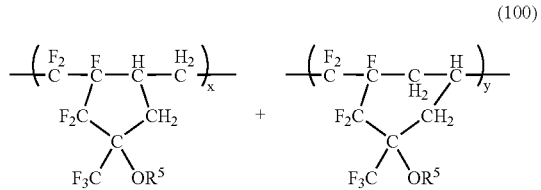

(100)

The thus obtained substrate on which the resist film covered with the protective film is formed is immersed in refractive index liquid (liquid having a refractive index larger than that of air and smaller than that of the resist film).

This immersed resist film on the substrate is selectively exposed through a desired mask pattern. Accordingly, in this case, the exposing light beam passes through the refractive index liquid and the protective film to reach the resist film.

At this time, since the resist film is completely blocked from the refractive index liquid, such as pure water, by the protective film, neither is the resist film degenerated due to swelling or the like by the invasion of the refractive index liquid nor is components of the resist film eluted into the refractive index liquid (e.g. pure water, deionized water, fluorosolvent, and such) to degenerate the optical characteristics thereof such as refractive index.

In this case, there is no limitation for the wavelength of the exposing light beam used for exposure, and radiation rays, such as ArF excimer laser, KrF excimer laser, $F_2$ excimer laser, EUV (Extreme Ultra Violet), VUV (Vacuum Ultra Violet), electron beams, X-rays, and soft X-rays may be used, and selected depending mainly on the characteristics of the resist film.

As mentioned above, in the method for forming a resist pattern of the present invention, a liquid having a refractive index larger than that of air and smaller than that of the resist film used (refractive index liquid) is placed on the resist film via the protective film during exposure. Examples of such refractive index liquids include water (water, deionized water) and fluorocarbon inert liquids. Specific examples of the fluorocarbon inert liquids include liquids comprised mainly of fluorocarbon compounds, such as $C_3HCl_2F_5$, $C_4F_9OCH_3$, $C_4F_9OC_2H_5$, or $C_5H_3F_7$. Among them, from the viewpoint of cost, safety, environmental problems, and general versatility, water (pure water or deionized water) is preferably used, however, when an exposing light of 157 nm wavelength is used, a fluorinated solvent is preferably used from the viewpoint of its lower absorbance of the exposing light.

The refractive index of the refractive index liquid used is not particularly limited as long as the refractive index is "larger than the refractive index of air and smaller than the refractive index of the resist composition used."

After completion of the exposure process in an immersed state, the substrate is taken out of the refractive index liquid, and then the protective film is removed.

Then, PEB (post-exposure baking) is performed for the exposed resist film keeping the protective film attached thereto, and is subsequently subjected to the development process using the alkaline developer consisting of alkaline solution.

Since the developer solution used in this development process is alkaline, the protective film is first dissolved, and subsequently the soluble portion of the resist film is dissolved away. In this case, the development process may be followed by the post-baking process. Preferably, the resist film is further rinsed using deionized water. This water rinse step is to wash away the developer solution and the residual protective film component and the resist composition dissolved by the developer solution on the substrate by dripping or spraying water on the substrate surface while the substrate is being rotated. Then, the resist film is dried to obtain the resist patterns formed exactly according the mask patterns. Thus, in the present invention, the protective film removal and resist film development are simultaneously achieved by a single development process.

By forming the resist patterns in this way, resist patterns with fine line widths, and in particular, line-and-space-patterns of small pitches may be produced with superior resolving ability. Herein, a pitch in the line-and-space-patterns is the total distance of the resist pattern width and the space width in the direction of the line width of the patterns.

EXAMPLES

Examples of the present invention will be described below, but these Examples are only for suitably explaining this invention but do not limit the invention. In the following description, the Comparative Example is also described with the Examples.

Example 1

In this example, a protective film was formed on the substrate using the material for forming a protective film according to the present invention to assess the waterproofness and solubility in the alkaline developer solution of this protective film. As a base polymer, a copolymer comprising the cyclic fluorinated alcohol constitutional unit represented by the aforementioned general formula (100) (the molecular weight is 13,800, $R^5$s are all hydrogen atoms, and the mole ratio is x:y=50:50). Two kinds of solvents, 2-methyl-1-propanol and 4-methyl-2-pentanol were used to prepare 2% by mass of the base polymer water solution respectively, and they were used as the compositions for forming the protective film.

The two kinds of compositions for forming the protective film were applied onto the semiconductor substrate using a spin coater under the coating conditions of 1500 rpm. After the coating, the protective film was cured by heat treatment at 90° C. for 90 seconds to obtain two kinds of protective films for assessment. The protective film formed using 2-methyl-1-propanol as a solvent (film 1) was 50.3 nm in film thickness; while the protective file formed using 4-methyl-2-pentanol as a solvent (film 2) was 28.3 nm in film thickness.

Assessment of the protective film was performed for the following three items: (i) the visual confirmation of the surface conditions, (ii) the measurement of the decrease in film thickness after a 90-sec rinse with pure water by simulating the film immersion into liquid (pure water) in the liquid immersion lithography process, and (iii) the dissolution rate of the protective film when immersed in the alkaline developer solution (2.28% TMAH) (converted into film thickness: nm/sec).

As a result, the visual surface conditions of films 1 and 2 were both excellent, with the film thickness of the film 1 being 50.8 nm after the water rinse and that of the film 2 28.8 nm after the water rinse, and with the surface conditions remaining good. Furthermore, the dissolution rate of the protective film by the developer solution was 3 nm/sec for film 1 and 2 nm/sec for film 2. No change in the surface conditions was observed with both films 1 and 2 subjected to a 90-sec rinse with pure water, and it was judged that the film thickness was also not affected by water.

Example 2

The following resin component, acid generator, and nitrogen-containing organic compound were homogeneously dissolved in an organic solvent to prepare the resist composition 1. As a resin component, 100 parts by mass of the polymer comprising constitutional units represented by the following general formula (102) shown below were used. The ratio of the respective constitutional units (l and m) used in preparing the resin component were set at l=50 mol % and m=50 mol %.

[Chemical formula 27]

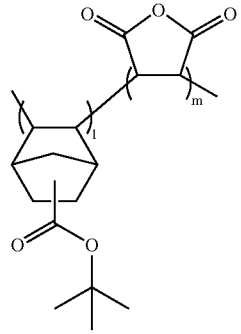

(102)

As the acid generator, 5.0 parts by mass of triphenylsulfonium nonafluorobutane sulfonate were used. And, as the organic solvent, 5.5% of ethyl lactate water solution was used. Furthermore, as the nitrogen-containing organic compound, 0.25 parts by mass of triethanolamine (0.5 parts by mass of tri-n-octylamine) were used.

The resist composition 1 prepared as described above was used to form the resist pattern. First, an organic antireflective film composition "AR-19" (product name, manufactured by Shipley Co., Ltd.) was applied onto a silicon wafer using a spinner and dried by baking on a hot plate at 215° C. for 60 sec to form an 82 nm-thick organic antireflective film. Onto this anti-reflective film, the resist composition 1 was applied using a spinner, and dried by pre-baking on a hot plate at 115° C. for 90 sec to form a 150 nm-thick resist film over the anti-reflection film.

The protective film material, which was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50) in 2-methyl-1-propyl alcohol and adjusting the resin concentration to 2.5% by mass, was spin-coated onto the resist film, and heated at 90° C. for 60 seconds to form a 72.1-nm thick protective film.

Next, the resist film was irradiated with (exposed to) a patterning light beam through the mask pattern using an ArF excimer laser (wavelength; 193 nm) by the exposure system NSR-S302B (Nikon Corporation, NA (numerical aperture)= 0.60, σ=0.75). Then, as a liquid immersion lithography treatment, while rotating the silicon wafer having the exposed resist film, pure water at 23° C. was continuously dripped on the resist film for 2 min. This step corresponds to the step in the practical production process in which the resist film completely immersed in the liquid is exposed. However, based on the above-mentioned analysis of the liquid immersion lithography method, the complete exposure performance in the optics has been theoretically guaranteed, such that for achieving an evaluation of only the effect of the immersion liquid on the resist film, the step with a simplified configuration was adopted in which first the resist film is exposed and pure water as refractive index liquid (immersion liquid) is applied to the resist film after exposure.

After the pure water-dripping process followed by a PEB treatment under the conditions at 115° C. for 90 seconds, the resist film was developed with the alkaline developer solution at 23° C. for 60 seconds leaving the protective film as it is. As the alkaline developer solution, 2.38% by mass of tetramethylammonium hydroxide water solution was used. By this development process, the protective film was completely removed and an excellent development of the resist film could be also achieved.

The resist pattern thus obtained having 300-nm 1:1 line-and-space was examined under a scanning electron microscope (SEM), and, was found that the resist pattern is excellent such that no fluctuation was observed at all.

Comparative Example 1

It was attempted that to form a resist pattern having 300-nm 1:1 line-and-space was formed in accordance with entirely the same procedure as in Example 2 using the positive type photoresist except that no protective film was formed. When the resist pattern is subsequently examined under a scanning electron microscope (SEM), the fluctuation and swelling of the pattern were too severe to observe the pattern.

Example 3

The following resin component, acid generator, and nitrogen-containing organic compound were homogeneously dissolved in the organic solvent to prepare the resist composition 1. As a resin component, 100 parts by mass of the copolymer comprising constitutional units represented by the chemical formula (103) shown below was used. The ratios of the respective constitutional units l, m and n used in preparing the resin component were set at l=40 mol %, m=40 mol %, and n=20 mol %.

[Chemical formula 28]

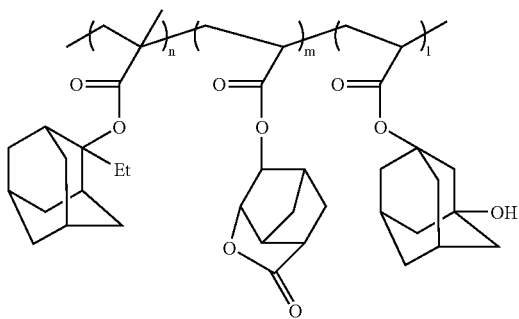

(103)

As the acid generator, 53.50 parts by mass of triphenylsulfonium nonafluorobutane sulfonate and 0.75 parts by mass of triphenylsulfonium-TF were used. And, as the organic solvent, a 6.0% aqueous solution of ethyl lactate was used. Furthermore, as the nitrogen-containing organic compound, 1.20 parts by mass of tri-2-(2-methoxyethoxy)ethylamine was used.

Using the resist composition 2 thus prepared, a resist pattern was formed. First, an organic antireflective film composition "AR-19" (product name, manufactured by Shipley Co., Ltd.) was applied onto the silicon wafer using a spinner and dried by baking on a hot plate at 215° C. for 60 seconds to form an 82-nm thick organic antireflective film. Using a spinner, the resist composition 2 was applied over this anti-reflection film, and dried by pre-baking the wafer on a hot plate at 115° C. for 90 seconds to form a 150-nm thick resist film over the anti-reflection film.

The protective film material, which was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50) in 2-methyl-1-propyl alcohol and adjusting the resin concentration to 2.5 percent by mass, was spin-coated onto the resist film with a spinner, and heated at 90° C. for 60 seconds to form a 72.1-nm thick protective film.

Next, the resist film was irradiated with a patterning light beam through the mask pattern using an ArF excimer laser (wavelength: 193 nm) by the exposure system NSR-S302B (Nikon Corporation, NA (numerical aperture)=0.60, σ=0.75). Then, as a liquid immersion lithography treatment, while rotating the silicon wafer having the exposed resist film, pure water at 23° C. was continuously dripped on the resist film for 2 min. This step corresponds to the step in the practical production process in which the resist film completely immersed in the liquid is exposed. However, based on the above-mentioned analysis on the liquid immersion lithography method, the complete exposure performance in the optics has been theoretically guaranteed, such that for achieving an evaluation of only the effect of the immersion liquid on the resist film, the step with a simplified configuration was adopted in which first the resist film is exposed and pure water as refractive index liquid (immersion liquid) is applied to the resist film after exposure.

After the pure water-dripping process followed by a PEB treatment under the conditions at 115° C. for 90 seconds, the resist film was developed with the alkaline developer solution at 23° C. for 60 seconds leaving the protective film as it is. As the alkaline developer solution, a 2.38% by mass of tetramethylammonium hydroxide water solution was used. By this development process, the protective film was completely removed and an excellent development of the resist film could be also achieved.

When the resist pattern thus obtained having 130-nm 1:1 line-and-space was examined under a scanning electron microscope (SEM), the pattern profile was found to be excellent such that no fluctuations or such were observed at all.

Example 4

The resin component, acid generator, and nitrogen-containing organic compound shown below were homogeneously dissolved in an organic solvent to prepare a resist composition. As a resin component, 100 parts by mass of the copolymer comprising constitutional units represented by the following chemical formula (104) shown below were used. The ratio of the respective constitutional units l, m and n used in preparing the resin component were set at l=20 mol %, m=40 mol %, and n=40 mol %.

[Chemical formula 29]

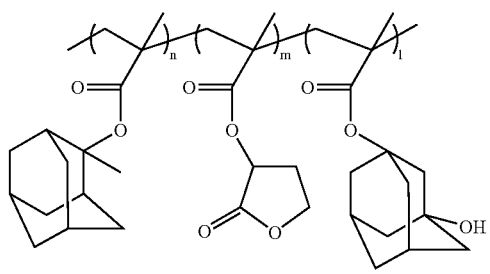

(104)

As an acid generator, 2.0 parts by mass of triphenylsulfonium nonafluorobutane sulfonate and 0.8 parts by mass of tri(tert-butylphenyl)sulfonium trifluoromethane sulfonate were used.

And, as the organic solvent, 7.0% by mass of the mixed solvent-water solution comprising propylene glycol monomethyl ether and propylene glycol monomethyl ether acetate (mixing ratio: 6:4) was used. As the nitrogen-containing organic compound, 0.25 parts by mass of triethanolamine was used. Furthermore, as an additive, 25 parts by mass of γ-butyrolactone were blended.

The resist composition prepared as described above was used to form the resist patterns. First, an organic antireflective film composition "ARC-29" (product name, manufactured by Brewer Co., Ltd.) was applied onto the silicon wafer using a spinner and dried by baking on a hot plate at 205° C. for 60 seconds to form a 77 nm-thick organic antireflective film. On this anti-reflective film, the resist composition was applied using a spinner, and dried by pre-baking on a hot plate at 130° C. for 90 seconds to form a 225-nm thick resist film.

The protective film material, which was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50 (mole percent)) and 10% by mass of $C_{10}F_{21}COOH$ relative to this copolymer in 2-methyl-1-propyl alcohol and adjusting the resin concentration to 2.6% by mass, was spin-coated onto the resist film with a spinner, and heated at 90° C. for 60 seconds to form a 70.0-nm thick protective film.

Next, using the exposure system Nikon-S302A (manufactured by Nikon Co., Ltd.) with an ArF excimer laser (wavelength: 193 nm), a patterning light was irradiated onto the resist film through the mask pattern. Then, as liquid immersion lithography treatment, while rotating the silicon wafer having the resist film exposed, pure water at 23° C. was continuously dripped onto the resist film for 2 minutes. This step corresponds to the step in the practical production process in which the resist film completely immersed in the liquid is exposed. However, based on the above-mentioned analysis on the liquid immersion lithography method, the complete exposure performance in the optics has been theoretically guaranteed, such that for achieving an evaluation of only the effect of the immersion liquid on the resist film, the step with a simplified configuration was adopted in which first the resist film is exposed and pure water as refractive index liquid (immersion liquid) is applied to the resist film after exposure.

After the pure water-dripping process followed by PEB treatment under the conditions at 115° C. for 90 seconds, the resist film was developed with the alkaline developer solution at 23° C. for 60 seconds leaving the protective film as it is. As the alkaline developer solution, a 2.38% by mass of tetramethylammonium hydroxide water solution was used. By this development process, the protective film was completely removed and an excellent resist film development could be also realized.

The resist pattern thus obtained having 130-nm 1:1 line-and-space was examined under a scanning electron microscope (SEM), and, as a result, this pattern profile was found to be of an excellent rectangular shape.

After subjecting the substrate, which had been exposed and dripped pure water, to stand in 2.0-ppb amine atmosphere for 60 minutes followed by a similar development treatment as described above, the resist pattern configuration was similarly observed. As a result, no significant difference from the aforementioned pattern profile was detected.

The dimensional fluctuation rate owing to stand in a 2.0-ppb amine atmosphere at this time after exposure was 0.53 nm/min.

Example 5

With the exception that a material for forming the protective film was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50 (mole percent)) and 10% by mass of a compound represented by the following chemical formula (105) shown below relative to this copolymer in 2-methyl-1-propyl alcohol and adjusting the resin concentration to 2.6% by mass, the resist pattern configuration was observed by entirely the same technique as that in Example 4.

[Chemical formula 30]

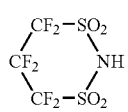

(105)

As a result, regardless of whether performing dry etching for 60 min or not, the obtained resist pattern having 130-nm 1:1 line-and-space was of an excellent rectangular shape.

Example 6

With the exception that a material for forming the protective film was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50 (mole percent)) and 10% by mass of $(C_4H_9SO_2)_2NH$ relative to this copolymer in 2-methyl-1-propyl alcohol and adjusting the resin concentration to 2.6% by mass, the resist pattern configuration was observed by entirely the same technique as that in Example 4.

As a result, regardless of whether performing dry etching for 60 min or not, the obtained resist patterns having a 130-nm 1:1 line-and-space were of an excellent rectangular shape.

Example 7

With the exception that the material for forming the protective film was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50), and 10% by mass of $C_{10}F_{21}COOH$ and furthermore 0.1% by mass of a compound represented by the chemical formula (105) relative to this copolymer in 2-methyl-1-propyl alcohol and adjusting the resin concentration to 2.6% by mass, the resist pattern was subjected to the development process immediately after exposure and dripped pure water thereto using exactly the same technique as that described in Example 4, and examined for this resist pattern configuration. As a result, the obtained resist pattern having a 130-nm 1:1 line-and-space was of an excellent rectangular shape, and no decrease in the film thickness was observed.

Furthermore, the resist pattern configuration was similarly observed after the substrate which had been exposed and treated with dripping pure water was subjected to dry etching in a 2.0-ppb amine atmosphere for 65 minutes followed by a similar development process as described above. As a result, no significant difference in the pattern profile from the aforementioned one was observed.

Example 8

With the exception that a material for forming the protective film was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50), and 10% by mass of $C_{10}F_{21}COOH$ and furthermore 0.4% by mass of a compound represented by the chemical formula (105) relative to this copolymer in 2-methyl-1-propyl alcohol and adjusting the resin concentration to 2.6% by mass, the resist pattern was subjected to the development process immediately after it was exposed and treated by dripping pure water thereto using exactly the same technique as that described in Example 4, and examined for this resist pattern configuration. As a result, the obtained resist pattern having 130-nm 1:1 line-and-space was of an excellent rectangular shape, and no decrease in the film thickness was observed.

Furthermore, the resist pattern configuration was similarly observed after the substrate which had been exposed and treated by dripping pure water thereto was subjected to dry etching in a 2.0-ppb amine atmosphere for 65 minutes followed by a similar development process as described above. As a result, no significant difference in the pattern profile from the aforementioned one was observed.

Example 9

With the exception that a material for forming the protective film was prepared by dissolving the copolymer comprising the cyclic fluorinated alcohol represented by the chemical formula (100) as the constitutional unit (the molecular weight is 13,800, $R^5$s are all hydrogen atoms, and the mole ratio is x:y=50:50), and 10% by mass of $C_{10}F_{21}COOH$ and furthermore 0.8% by mass of a compound represented by the chemical formula (105) relative to the this copolymer in 2-methyl-1-propyl alcohol and adjusting the resin concentration to 2.6% by mass, the resist pattern was subjected to the development process immediately after it was exposed and treated by dripping pure water thereto using exactly the same technique as that described in Example 4, and examined for this resist pattern configuration. As a result, the obtained resist pattern having 130-nm 1:1 line-and-space was of an excellent rectangular shape, and no decrease in the film thickness was observed.

Furthermore, the resist pattern configuration was similarly observed after the substrate which had been exposed and treated by dripping pure water thereto was subjected to dry etching in a 2.0-ppb amine atmosphere for 65 minutes followed by a similar development process as described above. As a result, no significant difference in the pattern profile from the aforementioned one was observed.

Example 10

The resin component, acid generator, and nitrogen-containing organic compound shown below were uniformly dissolved in an organic solvent to prepare a resist composition. As the resin component, 100 parts by mass of the copolymer comprising the constitutional unit represented by the chemical formula (106) shown below was used. The ratio of the constitutional units (l, m and n) used in preparing the resin components were l=50 mol %, m=30 mol % and n=20 mol %.

[Chemical formula 31]

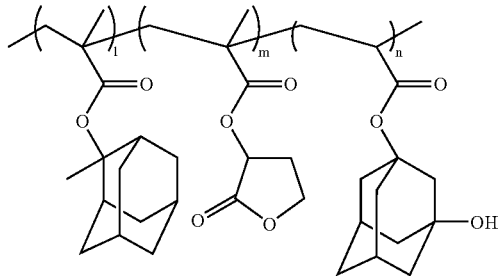

(106)

As the acid generator, 3.5 parts by mass of triphenylsulfonium nonafluorobutane sulfonate and 1.0 part by mass of diphenylmonomethylphenylsulfonium trifluoromethane sulfonate were used. And, as the organic solvent, a 7.0% by mass of the mixed solvent-water solution comprising ethyl lactate and propylene glycol monomethyl ether acetate (mixing ratio 4:6) was used. In addition, for the nitrogen containing organic compound, 0.3 parts by mass of triethanolamine was used.

The resist composition prepared as described above was used to form the resist patterns. First, an organic antireflective film composition "ARC29" (product name, manufactured by Brewer Co., Ltd.) was applied on the silicon wafer using a spinner and dried by baking on a hot plate at 205° C. for 60 seconds to form a 77-nm thick organic antireflective film. Then, the resist composition was applied onto this antireflective film using a spinner, and dried by pre-baking on a hot plate at 130° C. for 90 seconds to form a 225-nm thick resist film. The resulting coated substrate was referred to as the substrate for assessment 1.

a material for forming the protective film, which was prepared by dissolving a copolymer comprising the cyclic fluorinated alcohol represented by the chemical formula (100) as the constitutional unit (the molecular weight is 13,800, $R^5$s are all hydrogen atoms, and the mole ratio is x:y=50:50) and 10% by mass of $C_{10}F_{21}COOH$ relative to this copolymer in 2-methyl-1-propyl alcohol and adjusting the resin concentration to 2.6% by mass, was spin-coated on the substrate for assessment 1, and heated at 90° C. for 60 sec to form a 70.0-nm thick protective film. The resulting coated the substrate was referred to as substrate for assessment 2.

Next, after the substrates for assessment 1 and 2 were irradiated with the patterning light through a mask pattern with an exposure system Nikon-S302A (manufactured by Nikon) using ArF excimer laser (wavelength 193 nm), the respective substrates were extracted with 35 ml of pure water at room temperature for 5 minutes.

After the extract was concentrated (50-fold), the concentrations of the extracted amine, and those of extracted cations and anions assumed to be caused by the acid generator were quantitated by the capillary electrophoresis-mass spectrometry method. The results are shown in Table 1 shown below.

TABLE 1

|  | Substrate for Assessment 1 | Substrate for Assessment 2 |
|---|---|---|
| Extracted Amine Concentration | 0.07 | <0.02 |
| Extracted Cation Concentration | 18.0 | <1.2 |
| Extracted Anion Concentration | 10.0 | <1.2 |

(Unit: ng/cm$^2$)

Each value on the substrate for assessment 2 indicates that the results gave values below the detection limit by this analytical method.

These results clearly demonstrate that, in the liquid immersion lithography process, the elution amount of the resist component into the liquid immersion medium is suppressed by providing the protective film component according to the present invention.

INDUSTRIAL APPLICABILITY

As described above, in the present invention, even when a resist film is formed using any commonly used resist composition and even though any immersion liquid, in particular, water and fluorine-containing medium are used in the immersion lithography process, a high precision resist pattern can be obtained with no suffering from surface roughness, e.g., T-top form, high sensitivity, excellent resist pattern profile configuration, excellent depth of focus and excellent exposure margin excellent post exposure stability in dry etching process. Therefore, the use of the protective film according to the present invention makes it possible to effectively form a resist pattern using the liquid immersion lithography process.

The invention claimed is:

1. A material for forming a resist protective film formed on a resist film and used in a liquid immersion lithography process, wherein said material has the properties of transparency to an exposure light beam, insolubility in water; and alkali-solubility and wherein said material comprises at least a fluoropolymer, a solvent and a fluorocarbon compound, wherein the fluorocarbon compound is a fluorocarbon compound represented by the general formula (203) shown below:

[Chemical formula 2]

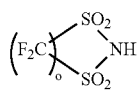
(203)

wherein o is an integer of 2 to 3.

2. The material for forming the resist protective film according to claim 1, wherein the fluorocarbon compound represented by the general formula (203) is a fluorocarbon compound represented by the chemical formula (208) shown below

[Chemical formula 4]

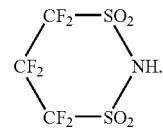
(208)

3. The material for forming a resist protective film according to claim 1, wherein the exposure light is a light having the main wavelength of 157 nm or 193 nm.

4. The material for forming a resist protective film according to claim 1, wherein the fluoropolymer is a polymer comprising a cyclic fluoroalcohol represented by the following general formula (100) as a constitutional unit:

[Chemical formula 1]

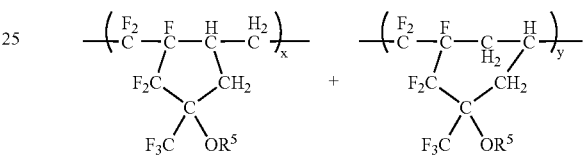
(100)

wherein R$^5$ is a hydrogen atom or a linear, branched or cyclic C$_1$ to C$_{15}$ alkyloxy group or alkyloxyalkyl group.

5. The material for forming a resist protective film according to claim 4, wherein the polymer containing the cyclic fluoroalcohol as a constitutional unit is dissolved in an alcoholic solvent.

6. A material for forming a resist protective film formed on a resist film and used in a liquid immersion lithography process, wherein said material has the properties of transparency to an exposure light beam, insolubility in water and alkali-solubility and wherein said material comprises at least a fluoropolymer, a solvent and a fluorocarbon compound, wherein the fluorocarbon compound is a fluorocarbon compound represented by the general formula (204) shown below:

[Chemical formula 3]

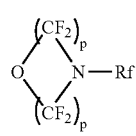
(204)

wherein p is an integer of 2 to 3; Rf is an alkyl group partially or entirely substituted with fluorine atom(s), and may be substituted with a hydroxyl group, alkoxy group, carboxyl group or amino group.

7. The material for forming the resist protective film according to claim 6, wherein the fluorocarbon compound represented by the general formula (204) is a fluorocarbon compound represented by the chemical formula (209) shown below.

[Chemical formula 5]

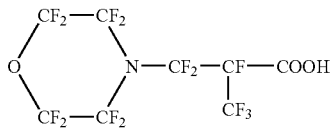
(209)

8. The material for forming a resist protective film according to claim 6, wherein the exposure light is a light having the main wavelength of 157 nm or 193 nm.

9. The material for forming a resist protective film according to claim 6, wherein the fluoropolymer is a polymer comprising a cyclic fluoroalcohol represented by the following general formula (100) as a constitutional unit:

[Chemical formula 1]

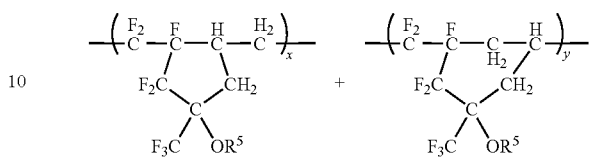
(100)

wherein $R^5$ is a hydrogen atom or a linear, branched or cyclic $C_1$ to $C_{15}$ alkyloxy group or alkyloxyalkyl group.

10. The material for forming a resist protective film according to claim 9, wherein the polymer containing the cyclic fluoroalcohol as a constitutional unit is dissolved in an alcoholic solvent.

* * * * *